(12) United States Patent
Reignoux et al.

(10) Patent No.: US 8,973,834 B2
(45) Date of Patent: Mar. 10, 2015

(54) SECURED IDENTIFICATION DOCUMENT

(75) Inventors: Yves Reignoux, Meudon Cedex (FR); Joseph Jerome Leibenguth, Meudon Cedex (FR); Severine Cheramy, Meudon Cedex (FR); Denis Groeninck, Meudon Cedex (FR); Denis Vere, Meudon Cedex (FR); Francois Roussel, Meudon Cedex (FR)

(73) Assignee: Gemalto SA, Meudon Cedex (FR)

( * ) Notice: Subject to any disclaimer, the term of this patent is extended or adjusted under 35 U.S.C. 154(b) by 2577 days.

(21) Appl. No.: 11/629,893

(22) PCT Filed: Apr. 18, 2005

(86) PCT No.: PCT/IB2005/001143
§ 371 (c)(1),
(2), (4) Date: Aug. 14, 2008

(87) PCT Pub. No.: WO2006/000849
PCT Pub. Date: Jan. 5, 2006

(65) Prior Publication Data
US 2011/0114732 A1    May 19, 2011

(30) Foreign Application Priority Data

Jun. 16, 2004  (EP) .................................... 04291520
Sep. 6, 2004   (EP) .................................... 04292139

(51) Int. Cl.
*G06K 19/06*    (2006.01)
*G06K 19/077*   (2006.01)
(Continued)

(52) U.S. Cl.
CPC ........ *G06K 19/07749* (2013.01); *G06K 19/025* (2013.01); *G06K 19/073* (2013.01);
(Continued)

(58) Field of Classification Search
CPC .................. G06K 19/07745; G06K 19/07749; G06K 19/07728; G06K 19/077; G06K 19/07747; G06K 19/025
USPC ....................................... 235/492; 340/572.1
See application file for complete search history.

(56) References Cited

U.S. PATENT DOCUMENTS 5,528,222 A     6/1996  Moskowitz et al.
5,888,624 A *   3/1999  Haghiri et al. ............. 428/195.1
(Continued)

FOREIGN PATENT DOCUMENTS

EP    0 383 435    8/1990
EP    0 952 542   10/1999
(Continued)

OTHER PUBLICATIONS

English translation of JP 09109577 to Wakana.*
(Continued)

*Primary Examiner* — Christopher Stanford
(74) *Attorney, Agent, or Firm* — Osha • Liang LLP

(57) ABSTRACT

A secured identification document has at least two flexible layers embedding an electronic module. The electronic module includes a flexible substrate on which are positioned an antenna and a radiofrequency microcontroller storing identification data. The radiofrequency microcontroller is electrically connected to said antenna. The secured identification document has the at least two flexible layers locally joined together by means of a chemically and mechanically tamper proof material that is applied in cavities that are distributed in each of said at least two flexible layers that surround the electronic module in order to make the electronic module interdependent with the at least two flexible layers.

20 Claims, 4 Drawing Sheets

(51) Int. Cl.
*G06K 19/02* (2006.01)
*G06K 19/073* (2006.01)
*H01Q 1/22* (2006.01)
*H01Q 1/52* (2006.01)
*H01Q 7/00* (2006.01)
*H04K 3/00* (2006.01)

(52) U.S. Cl.
CPC .... *G06K19/07327* (2013.01); *G06K 19/07372* (2013.01); *G06K 19/07381* (2013.01); *G06K 19/07722* (2013.01); *G06K 19/07745* (2013.01); *H01Q 1/2208* (2013.01); *H01Q 1/526* (2013.01); *H01Q 7/00* (2013.01); *H04K 3/68* (2013.01); *H04K 3/86* (2013.01); *H04K 2203/20* (2013.01); *H01L 2924/0002* (2013.01)
USPC ........................................................ 235/492

(56) References Cited

U.S. PATENT DOCUMENTS

| | | | |
|---|---|---|---|
| 6,100,804 A * | 8/2000 | Brady et al. | 340/572.7 |
| 6,404,643 B1 * | 6/2002 | Chung | 361/737 |
| 2005/0128086 A1 * | 6/2005 | Brown et al. | 340/572.8 |
| 2005/0189638 A1 * | 9/2005 | Ikeda | 257/679 |

FOREIGN PATENT DOCUMENTS

| | | | | |
|---|---|---|---|---|
| EP | 1 081 201 | | 3/2001 | |
| GB | 2 267 683 | | 12/1993 | |
| GB | 2267683 A | * | 12/1993 | ............ G06K 19/077 |
| JP | 61095486 A | * | 5/1986 | ............. G06K 19/00 |
| JP | 09109577 A | * | 4/1997 | ............. B42D 15/10 |
| WO | WO-00/21031 | | 4/2000 | |

OTHER PUBLICATIONS

International Search Report issued in International Application No. PCT/IB2005/001143, mailed Sep. 3, 2005, 3 pages.

* cited by examiner

SECURED IDENTIFICATION DOCUMENT

BACKGROUND

The invention relates to secured identification documents and method for making them. More particularly, it relates to secured identification documents such as passports, made of paper booklets, or contactless smart cards or RFID tags, made of paper or plastic cards or tickets and which contain personal data of their holder such as his/her name, birth date, address, photograph, etc.

With the development of electronic identity documents, process have been implemented to include electronic devices, comprising an antenna and a radio frequency microcontroller electrically connected to said antenna, inside flexible document pages, flexible document covers, or flexible external layers of smart cards, in an efficient and robust way.

In FIG. 1, a prior art module 10 is embedded inside a pre-laminated inlet 12. The module comprises an integrated circuit 11 affixed onto a support 13. The integrated circuit and its connections are protected by a resin 14. The support 13 has electrical pads 15 connected to the integrated circuit 11. An antenna 16 is etched on a first plastic layer 12A of the inlet. The antenna is connected to electrical contact pads 15. Then a second plastic layer 12B is laminated onto the first layer 12A to create the inlet 12. This second plastic layer 12B recovers antenna 16 and module 10 in order to protect them physically. The inlet 12 is then affixed to a fibrous cover sheet 20 and an internal sheet 19 of a paper booklet constituting a passport for example.

FIGS. 2A and 2B, illustrate another embodiment of a prior art module, named "coil on module", integrated in a cover sheet of a passport booklet (FIG. 2A) and in a contactless smart card (FIG. 2B). These structures and methods for manufacturing them have been implemented by the applicant. The "coil-on-module" means that the antenna 16 is part of the module itself and not part of a separate body like an inlet plastic sheet 12A as in the first prior art embodiment of FIG. 1. The coil-on-module comprises a flexible substrate 30 on which is etched the antenna and is positioned a radio frequency microcontroller storing identification data, said radio frequency microcontroller being electrically connected to the antenna.

In the embodiment of FIG. 2A, the coil on module is inserted in a multilayer arrangement, in which at least one layer 24, 25 has a cavity 23 incorporating the module 21. Layers incorporating the module are then affixed onto the cover sheet 20 and internal sheet 19 by means of standard glue layers 22, made of pressure sensitive glues or thermo sensitive glues.

In the embodiment of FIG. 2B, the coil on module 10 is embedded between two external flexible layers 32, 33 of a smart card. For that, the module is either incorporated in a cavity of a spacer layer positioned between the two external layers 32, 33, or embedded in a standard glue layer 22.

In both mentioned product types, standard pressure sensitive adhesive such as acrylic glues, or standard thermo sensitive glues such as phenolic glues, are used in order to bond the module and the various other layers.

This results to a good-looking end device, which offer generally a good mechanically behaviour and a high resistance to delamination.

Nevertheless, the device keeps vulnerable against chemical products and particularly against solvent and acids. For example, after one hour soaked in acetone, the different layers can easily been separated without damage of the electronic component or of the external cover.

Thus, it appears easy to a fraudulent person to pull out the module from a passport or from an identification card, by delamination of the constitution layers, and to reuse this module in another falsified passport or identification device.

SUMMARY

Considering the above, a problem intended to be solved by the invention is to develop a secured identification document, comprising at least two flexible layers embedding an electronic module, said electronic module including a flexible substrate on which are positioned an antenna and a radiofrequency microcontroller storing identification data, said microcontroller being electrically connected to said antenna, said identification document being physically resistant against all type of attacks in order to avoid a fraudulent person pulling out the module from the identification document by delamination of the constitution layers.

In a first aspect, the solution of the invention to this problem consists in strongly embedding the electronic module and making it interdependent with the stack of said at least two flexible layers by means of a chemically and mechanically tamper proof material.

Advantageously, the chemically and mechanically tamper proof material is made of epoxy glue, UV activated glue, benzo-cyclo-butene glue or polyimide glue.

Such tamper proof material is very interesting because it is mechanically resistant and chemically resistant, more particularly solvent resistant. Its use make sure that the module is strongly embed in a stack of layers and cannot easily pulled out from the identification device by chemical attacks such as solvent or acid attacks for example.

In another embodiment the tamper proof material can also be made of plastic or metallic rivet. In such a case, rivets are not as flexible as the glues. Nevertheless, the use of rivet is interesting to affix the module on a layer, because a mechanical attack to pull out the module from an identification device can destroy the module by breaking the antenna and, in a better case, the silicon chip.

Another advantageous feature of the secured identification document according to the invention is: said at least two flexible layers comprise cavities filled with said chemically and mechanically tamper proof material in order to strongly stick the layers together and to embed the electronic module in the obtained stack of layers constituting the identification document. More particularly, each cavity of a first flexible layer is positioned above another cavity of a second layer in such a manner that cavities are piled up in the stack of said at least two layers.

These piles of cavities filled with the chemically and mechanically tamper proof material bring advantageously an external mark, or stamp, to prove authenticity and un-falsification of the identity document.

Correlatively, the solution of the invention relates to a method for making a secured identification document comprising at least two flexible layers embedding an electronic module, said electronic module including a flexible support on which are positioned an antenna and a radiofrequency microcontroller storing identification data, said microcontroller being electrically connected to said antenna, wherein said method comprises following steps:

positioning said electronic module between said at least two flexible layers, providing a chemically and mechanically tamper proof material to strongly embed the electronic module and make it interdependent with the stack of said at least two flexible layers.

For a better understanding of the present invention, reference will now be made, by way of examples, to the following description of the invention and to the accompanying drawings, in which:

DETAILED DESCRIPTION

Corresponding numerals and symbols in the figures refer to corresponding parts, unless otherwise indicated.

Figure 1:
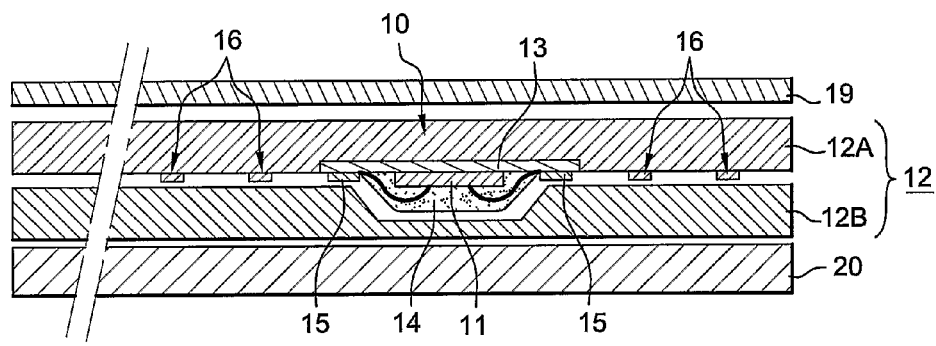
FIG. 1, already described, is a schematic cross-section illustrating an identification document according to the prior art, FIGS. 2A and 2B, already described, are schematic cross-section illustrating respectively a passport and an identification smart card of the prior art.
Figure 2A:
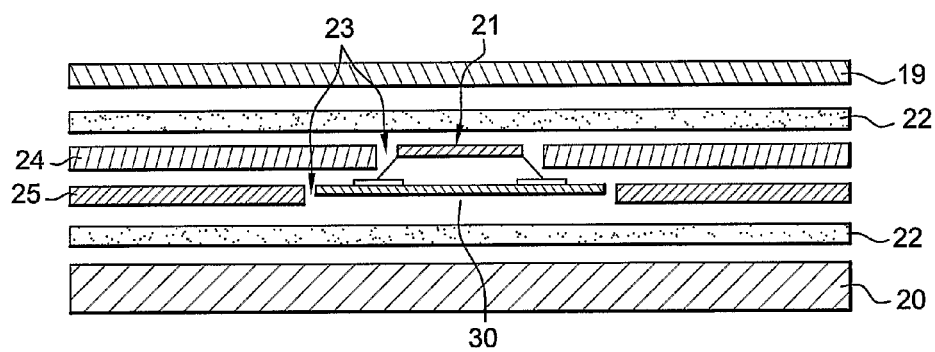
Figure 2B:
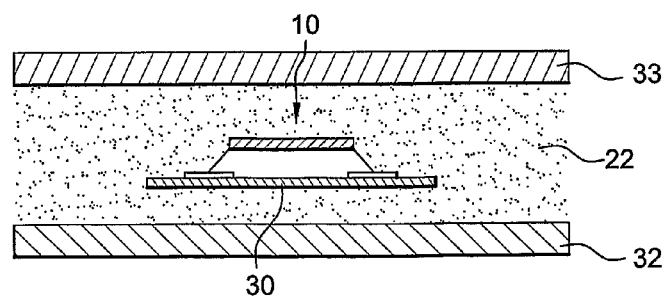
Figure 3A:
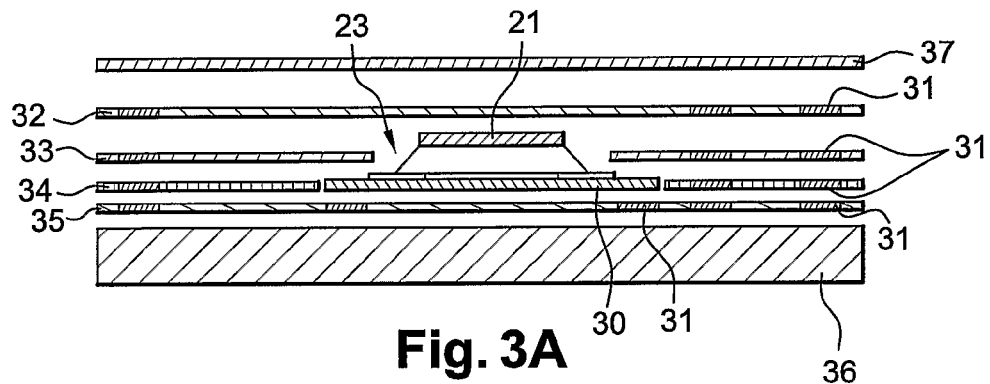
FIGS. 3A to 3C, are respectively an exploded cross-sectional view, a cross-sectional view, and a front view of a secured identification document according to a first embodiment of the invention.
Figure 3B:
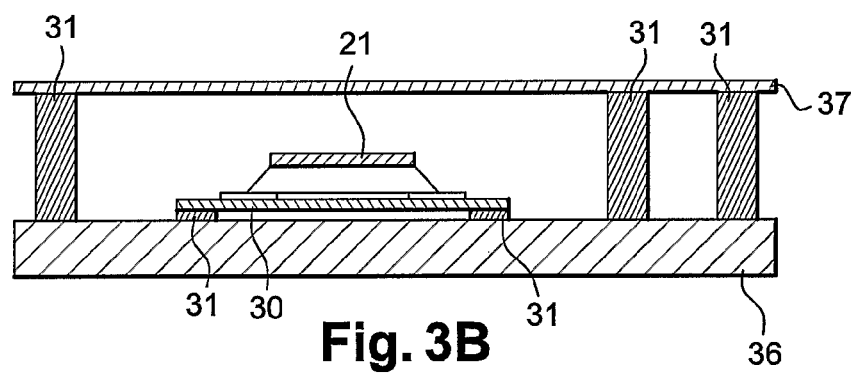
Figure 3C:
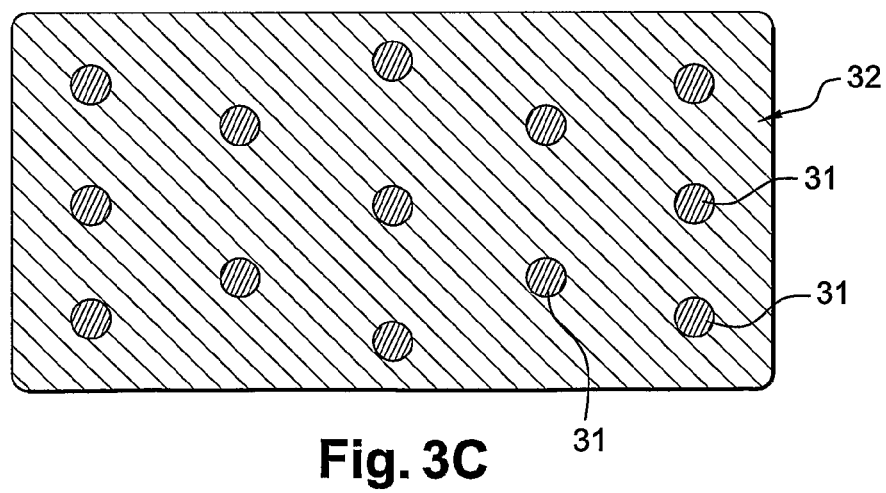

In a first embodiment of the invention, FIGS. 3A to 3C, a contactless inlay 21, which host an antenna and a silicon chip coated with resin, on one flexible substrate 30 is embedded between two flexible external layers 36 and 37, made of fibrous material such as paper or paperboard, or of plastic. The illustrated identification document constitutes either a passport, such as a paper booklet, or a contactless identification smart card made of paper or of plastic. In this embodiment, several intermediate layers 32-35 are stacked in such a manner that they incorporate the module 21. These layers 32-35 are made of paper, paperboard or of plastic. At least one layer 33, 34 of the stack of multilayer comprises a cavity 23 which surrounds at least partially the module 21.

The different paper, polymer or textile layers 32-35 are provided with cavities 31 which are filled with mechanically and chemically tamper proof glue, in order to strongly stick these layers together and to make the module 21 interdependent with the stack of layers constituting the product.

Preferably, cavities 31 of a first layer 32 are positioned above corresponding cavities 31 of a lower layer 33-35, in such a manner that cavities 31 are piled up in the stack of layers 32-35. These piles of cavities form columns and are filled with the mechanically and chemically tamper proof material in order to stick the different layers 32-37 together and to embed very strongly the module 21 in the stack of layers.

Preferably, a layer 35 provided between the flexible substrate 30 of the module 21 and an external layer 36 comprises also at least one cavity 31 positioned below the flexible substrate 30 of the module, and filled with the tamper proof glue in order to affix very strongly the module onto the external layer 36.

Advantageously, the mechanically and chemically tamper proof material is made of epoxy glue, UV activated glue, benzo-cyclo-butene glue or polyimide glue. These glues are mechanically resistant and they are resistant again chemical attacks, such as attacks made with solvents or acids.

More particularly, in addition to standard plastic or glue layers already selected for the encapsulation, such as pressure sensitive glues or thermo sensitive glues, specific solvent resistant glues are used to make certain that the coil on module stays interdependent with the external cover, and/or the intermediate paper or plastic layers.

A further advantage of the specific tamper proof glues relates to the cost per kg of these glues. Namely, some of the epoxy or UV glues are less expensive than some of the standard thermo sensitive glues or pressure sensitive glues which are already used for the encapsulation.

The tamper proof material can also be made of plastic or metallic rivet.

Thus, fraudulent attempts to pull out the module from the passport or the card, will result in a destruction of the different layers 32-37, of the flexible substrate 30 of the module 21 and of the antenna. This can also result, in a better case, in the breakage of the radio frequency microcontroller.

Advantageously, cavities 31 are distributed on the whole surface of said layers 32-35, as illustrated on the front view of FIG. 3C. These cavities filled with the tamper proof material bring marks. These marks can be used to prove the authenticity and un-falsification of the identification document. Namely, if these marks become damaged, it means that a fraudulent person tried to pull out the module from the document by delamination of the layers.

These marks are apparent on the surface of the upper intermediate layer 32 and the lower intermediate layer 35 of the stack of layers 32-35, when at least one flexible external layer 36 or 37 is delaminated.

In other embodiments, either at least one of the external layers 36, 37 can be made transparent in order to make these marks visible, or marks are directly apparent on at least one of the external layers 36, 37 which also comprise cavities 31.

Figure 4A:
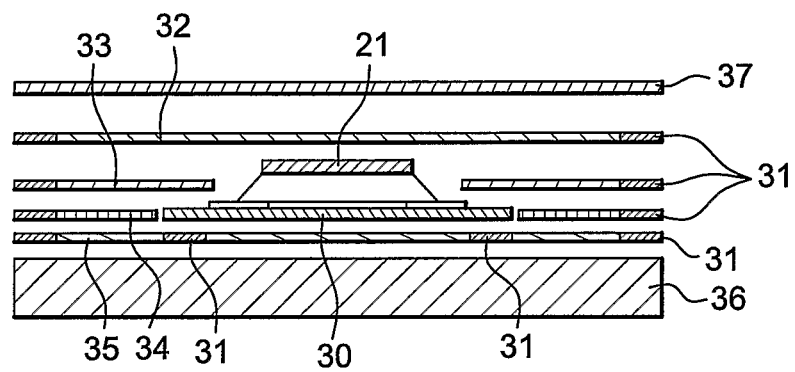
FIGS. 4A to 4C, are respectively an exploded cross-sectional view, a cross-sectional view and a front view of a secured identification document according to a second embodiment of the invention.
Figure 4B:
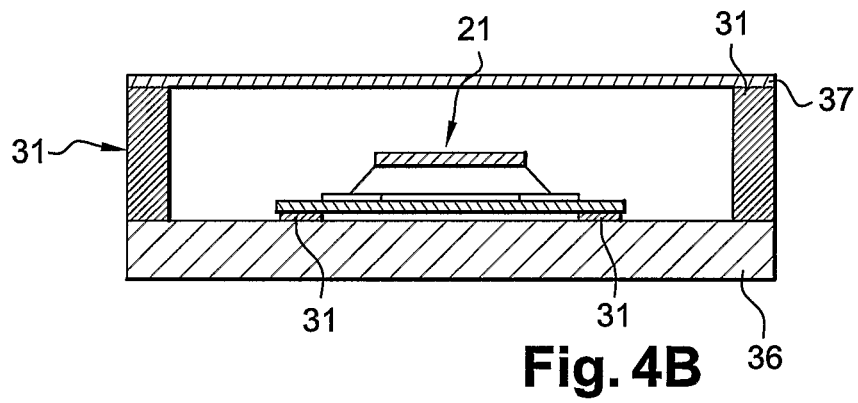
Figure 4C:
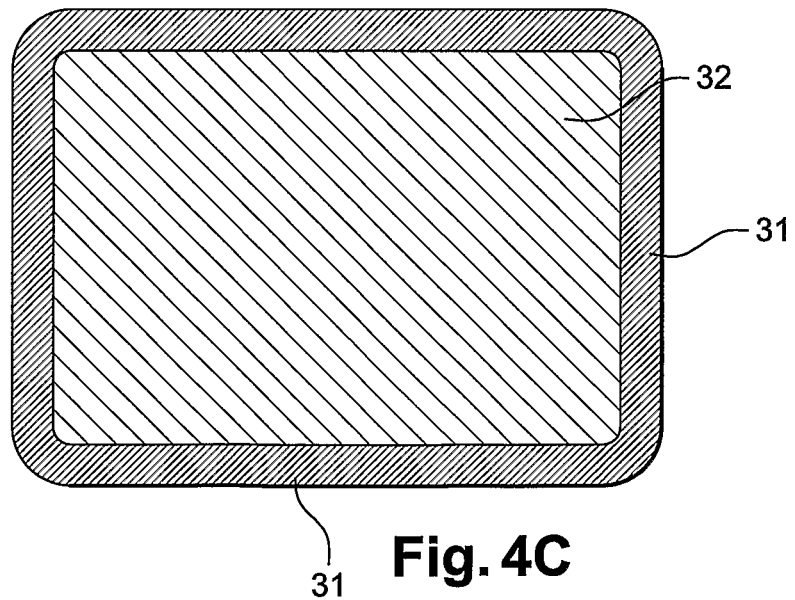

In a second embodiment of the invention, FIGS. 4A to 4C, cavities 31 provided in the stack of layers 32-35, and filled with the mechanically and chemically tamper proof glue, are positioned at the periphery of the identification document, namely at the periphery of the page of a passport booklet or at the periphery of the identification smart card.

Figure 5:
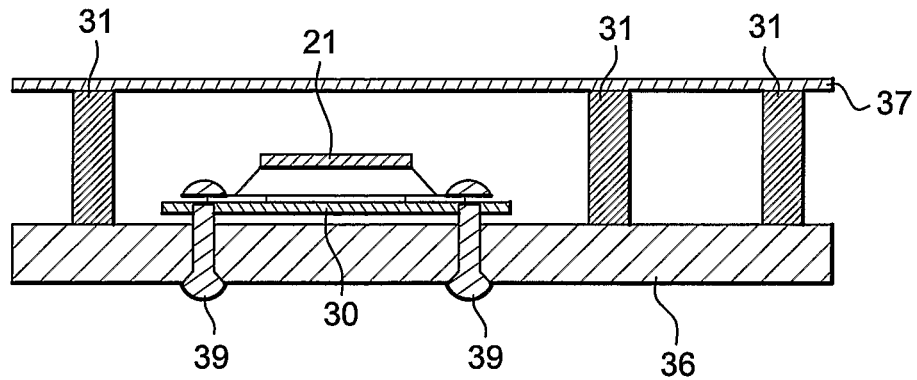
FIG. 5 is a cross-sectional view of a secured identification document of a third embodiment of the invention.

An alternate solution to the above embodiments consists to replace the tamper proof glue placed between the module 21 and an external flexible layer 36, by plastic or metallic rivets 39. This third embodiment is illustrated in FIG. 5. The rivets 39 are specially placed in standard apertures, of the flexible substrate 30 of the module, which are provided close to its edges, and used to displace the substrate 30 during the manufacture of the modules, prior to their cutting off. Rivets 39 increase the adhesion of the module 21 to the external flexible layer 36 thus preventing fraudulent attempts to pull out the module from the passport or the identification smart card. Any attempts to pull out the module will result in the destruction of the support layer 30 of the module, of the antenna, and can also result, in better case, in the destruction of the radio frequency microcontroller.

More particularly, when the layers of the identification document are made of plastic, it is the case of a smart card for example, the use of an ultra-sonic welding cogwheel will allow a natural riveting of the module with the at least two plastic layers. An embodiment to manufacture those rivets 39 consists in an ultra-sonic welding of the plastic layers of the stack of layers against the module. The module 21 is placed between at least two plastic layers and an ultra-sonic cogwheel is moved along and on both sides of the plastic layers, in order to bond the plastic layers and more particularly to bond the module with the plastic layers. For that, the plastic layers are locally melted and the melted plastic fill in the standard apertures of the flexible substrate 30 of the module 21. The module is then riveted inside the stack of plastic layers and impossible to remove without destruction.

Figure 6A:
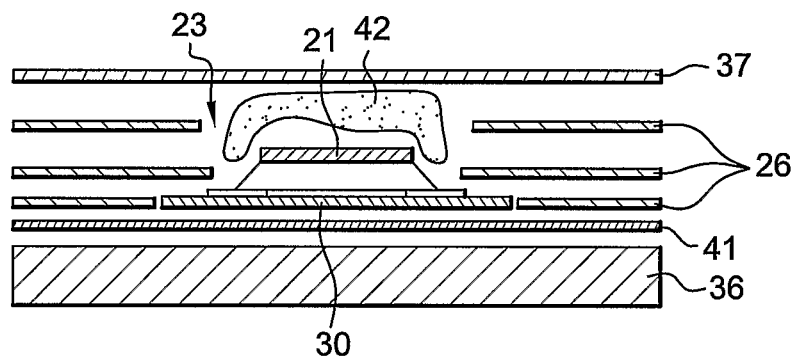
FIGS. 6A and 6B are respectively an exploded cross-sectional view and a cross-sectional view of a secured identification document according to a fourth embodiment of the invention.
Figure 6B:
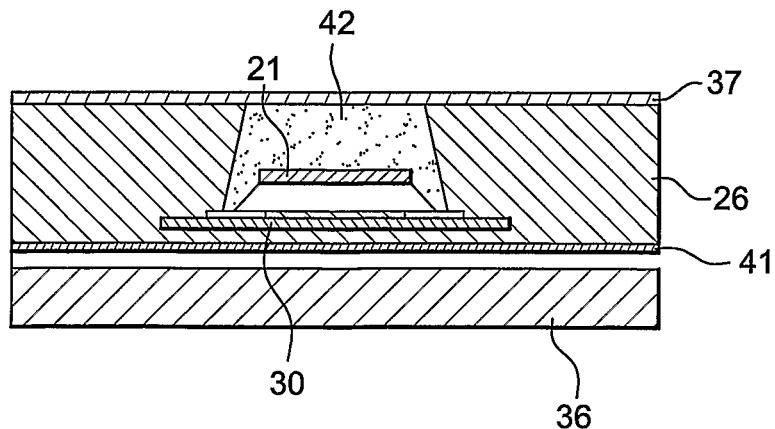

In a further embodiment, FIGS. 6A and 6B, the adhesion of the module 21 to the external flexible layers 36, 37 is improved by replacing acrylic or phenolic complete standard glue layers 26, or intermediate layers 26 affixed with a conventional glue layer, by a solvent resistant glue layer 41 which is also mechanically resistant.

In general, the polymerization of the specific glue layers 41 or glue piles 31 is obtained by UV activation in oven or thermal activation in laminator.

Nevertheless, as such glues or resins are generally rigid, an alternative would be to limit them to a thin coating 41, having a thickness of 20-40 μm, of the internal face of the textile or plastic external layer 36. The coating can be done by wet spreading, such as silk screen printing, wet rolls, etc. . . . , or with specific sheet of acid and solvent resistant resin. Then the coil on module 21 is stick on it, and the rest of the assembly is done with standard glue layers.

An additional acid and solvent resistant resin 42 can also be provided to fill the cavity 23 made in at least one upper layer 26, around the electronic module 21, to also make it interdependent with the upper layers 26 and 37.

The previous embodiments were described for a contactless identification document, such as a passport or an identification smart card. The invention is well adapted to all multilayer structures integrating an electronic device and where the product needs to be tamper resistant. Especially this is the case for the electronic passport and for contactless identification smart cards. However, it will be obvious for the person skilled in the art to accommodate the technology described hereby to other flexible devices comprising one or several modules or other electric or electronic components.

What is claimed is:

1. A secured identification document comprising:
    at least two flexible layers embedding an electronic module, said electronic module including a flexible substrate on which are positioned:
        an antenna; and
        a radiofrequency microcontroller storing identification data, said radiofrequency microcontroller being electrically connected to said antenna,
    wherein said at least two flexible layers comprise cavities filled with a chemically and mechanically tamper proof material in order to stick the at least two flexible layers together and to embed the electronic module in the at least two flexible layers constituting the secured identification document.

2. The secured identification document of claim 1, wherein each cavity of a first flexible layer of the at least two flexible layers is positioned above another cavity of a second flexible layer of the at least two flexible layers in such a manner that cavities are piled up in a stack of said at least two flexible layers.

3. The secured identification document of claim 1, wherein cavities are distributed on a whole surface of said at least two flexible layers.

4. The secured identification document of claim 1, wherein cavities are positioned at a periphery of said at least two flexible layers.

5. The secured identification document of claim 1, wherein said chemically and mechanically tamper proof material is made of at least one selected from a group consisting of epoxy glue, UV activated glue, benzo-cyclo-butene glue, and polyimide glue.

6. The secured identification document of claim 1, wherein said chemically and mechanically tamper proof material is made of at least one selected from a group consisting of plastic and metallic rivet.

7. The secured identification document of claim 1, wherein said at least two flexible layers are made of a fibrous material.

8. The secured identification document of claim 7, wherein said fibrous material is at least one selected from a group consisting of paper and paperboard.

9. The secured identification document of claim 1, wherein said at least two flexible layers are made of plastic.

10. The secured identification document of claim 1, wherein the electronic module is affixed onto at least one of the at least two flexible layers by means of rivets which are positioned through apertures of the flexible substrate.

11. The secured identification document of claim 1, wherein the identification document is a passport.

12. The secured identification document of claim 1, wherein the identification document is a contactless smart card.

13. A method for making a secured identification document comprising at least two flexible layers embedding an electronic module, said electronic module including a flexible substrate on which are positioned an antenna and a radiofrequency microcontroller storing identification data, said radiofrequency microcontroller being electrically connected to said antenna, wherein said method comprises following steps:
    positioning said electronic module between said at least two flexible layers,
    providing cavities in said at least two flexible layers, and
    filling said cavities with a chemically and mechanically tamper proof material in order to stick locally the said at least two flexible layers together and to make the electronic module interdependent with said at least two flexible layers.

14. The method of claim 13, wherein each cavity of a first flexible layer of the at least two flexible layers is positioned above another cavity of a second flexible layer of the at least two flexible layers, in such a manner that cavities are piled up in a stack of said at least two flexible layers.

15. The method of claim 14, consisting in positioning the cavities on a whole surface of said at least two flexible layers.

16. The method of claim 14, consisting in positioning the cavities at a periphery of said at least two flexible layers.

17. The method of claim 13, wherein said chemically and mechanically tamper proof material is made of at least one selected from a group consisting of epoxy glue, UV activated glue, benzo-cyclo-butene glue, and polyimide glue.

18. The method of claim 13, wherein said chemically and mechanically tamper proof material is made of at least one selected from a group consisting of plastic and metallic rivet.

19. The method of claim 18, wherein apertures are implemented in the flexible substrate of the electronic module and the electronic module is affixed onto a flexible layer by means of rivets positioned through these apertures.

20. A secured identification document comprising:
    a first flexible layer comprising a first cavity extending through the first flexible layer;
    a second flexible layer comprising a second cavity extending through the second flexible layer;
    an electronic module comprising a flexible substrate, an antenna positioned on the flexible substrate, and a radiofrequency microcontroller positioned on the flexible substrate and configured to store identification data, wherein the radiofrequency microcontroller is electrically connected to the antenna; and a chemically and mechanically tamper proof material configured to bind the first flexible layer and the second flexible layer together and to embed the electronic module between the first flexible layer and the second flexible layer, wherein first cavity is aligned with the second cavity, and wherein the first cavity and the second cavity are filled with the chemically and mechanically tamper proof material; and further comprising a third cavity extending through the first flexible layer;

fourth cavity extending through the second flexible layer;

wherein the third cavity is aligned with the fourth cavity, and wherein the third cavity and the fourth cavity are filled with the chemically and mechanically tamper proof material.

* * * * *